(12) United States Patent
Wang et al.

(10) Patent No.: US 12,408,521 B2
(45) Date of Patent: Sep. 2, 2025

(54) DISPLAY PANEL, METHOD FOR MANUFACTURING THE SAME AND DISPLAY DEVICE

(71) Applicant: BOE TECHNOLOGY GROUP CO., LTD., Beijing (CN)

(72) Inventors: Guoying Wang, Beijing (CN); Pan Xu, Beijing (CN); Yicheng Lin, Beijin (CN); Ying Han, Beijin (CN); Xing Zhang, Beijin (CN); Zhen Song, Beijin (CN); Dacheng Zhang, Beijin (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 552 days.

(21) Appl. No.: 17/613,691

(22) PCT Filed: Feb. 20, 2021

(86) PCT No.: PCT/CN2021/077045
§ 371 (c)(1),
(2) Date: Nov. 23, 2021

(87) PCT Pub. No.: WO2022/174414
PCT Pub. Date: Aug. 25, 2022

(65) Prior Publication Data
US 2023/0087701 A1    Mar. 23, 2023

(51) Int. Cl.
*H10K 59/131*    (2023.01)
*H10K 59/12*    (2023.01)

(52) U.S. Cl.
CPC ....... *H10K 59/131* (2023.02); *H10K 59/1201* (2023.02)

(58) Field of Classification Search
None
See application file for complete search history.

(56) References Cited

U.S. PATENT DOCUMENTS

| 10,347,665 | B2 | 7/2019 | Kim et al. |
| 10,355,069 | B2 | 7/2019 | Kim et al. |

(Continued)

FOREIGN PATENT DOCUMENTS

| CN | 106782249 A | 5/2017 |
| CN | 107275365 A | 10/2017 |

(Continued)

*Primary Examiner* — Jay C Chang
(74) *Attorney, Agent, or Firm* — Lippes Mathias LLP

(57) ABSTRACT

Provided is a display panel, including: a substrate provided with a display region and a non-display region disposed at a periphery of the display region; a plurality of first power signal lines and a plurality of drive signal lines that are disposed in the display region; and a power connection bus, a plurality of first fan-out leads, and a plurality of second fan-out leads that are disposed in the non-display region, wherein the power connection bus is electrically connected to the first power signal line and the first fan-out lead respectively; the plurality of second fan-out leads are electrically connected to the plurality of drive signal lines in a one-to-one correspondence; each first fan-out lead is disposed between every two adjacent second fan-out leads; and the plurality of first fan-out leads and the plurality of second fan-out leads are both configured to be electrically connected to a driving chip.

19 Claims, 5 Drawing Sheets

(56) References Cited

U.S. PATENT DOCUMENTS

| | | | |
|---|---|---|---|
| 10,644,091 B2 | 5/2020 | Liu et al. | |
| 2012/0206684 A1 | 8/2012 | Lee et al. | |
| 2017/0154599 A1 | 6/2017 | Huang et al. | |
| 2019/0229160 A1* | 7/2019 | Lee | H10K 59/131 |
| 2020/0343326 A1* | 10/2020 | Park | G09G 3/3266 |
| 2021/0225982 A1 | 7/2021 | Yi | |
| 2022/0291782 A1* | 9/2022 | Hyun | G06F 3/04164 |

FOREIGN PATENT DOCUMENTS

| | | |
|---|---|---|
| CN | 108493226 A | 9/2018 |
| CN | 109616480 A | 4/2019 |
| CN | 110164949 A | 8/2019 |
| CN | 109326628 B | 3/2020 |
| CN | 111477675 A | 7/2020 |
| TW | 201813078 A | 4/2018 |

* cited by examiner

DISPLAY PANEL, METHOD FOR MANUFACTURING THE SAME AND DISPLAY DEVICE

CROSS-REFERENCE TO RELATED APPLICATION

This application is a 371 of PCT Application PCT/CN2021/077045 filed Feb. 20, 2021, the disclosure of which is herein incorporated by reference in its entirety.

TECHNICAL FIELD

The present disclosure relates to the field of display technologies, and in particular relates to a display panel, a method for manufacturing the same, and a display device.

BACKGROUND

With the development of display technologies, display devices are used more and more widely. Display devices usually include smartphones, tablet computers, televisions, monitors, and the like.

Generally, a display device includes a display panel and a driving chip. The display panel is provided with a display region and a non-display region. The display panel includes a plurality of sub-pixels and signal lines electrically connected to the plurality of sub-pixels that are disposed in the display region, and a lead disposed in the non-display region. The lead is electrically connected to a plurality of signal lines and the driving chip, respectively. In this way, the driving chip controls the plurality of sub-pixels via the lead and the plurality of signal lines, such that the display panel can display a picture.

However, a non-display region in the currently used display panel is larger in width, which results in a lower screen-to-body ratio of the display device, which affects the display effect of the display device.

SUMMARY

Embodiments of the present disclosure provide a display panel, a method for manufacturing the same, and a display device. In the prior art, a display device has a low screen-to-body ratio, which affects the display effect of the display device. The problem can be solved by the following technical solutions:

According to a first aspect, a display panel is provided. The display panel includes:

a substrate provided with a display region and a non-display region disposed at a periphery of the display region;

a plurality of first power signal lines and a plurality of drive signal lines that are disposed in the display region; and a power connection bus, a plurality of first fan-out leads, and a plurality of second fan-out leads that are disposed in the non-display region, wherein the power connection bus is electrically connected to the first power signal line and the first fan-out lead respectively; the plurality of second fan-out leads are electrically connected to the plurality of drive signal lines in a one-to-one correspondence; each first fan-out lead is disposed between every two adjacent second fan-out leads; and the plurality of first fan-out leads and the plurality of second fan-out leads are both configured to be electrically connected to a driving chip.

Optionally, one first fan-out lead corresponds to n first power signal lines; and the first fan-out lead is configured to apply a first power signal to the n first power signal lines corresponding to the first fan-out lead via the power connection bus, wherein n is an integer greater than or equal to 1.

Optionally, on the power connection bus, a number of second connection points distributed on a side of a first connection point is equal to a number of second connection points distributed on another side of the first connection point, wherein the first connection point is a connection point for connecting the first fan-out lead to the power connection bus; and the second connection point is a connection point for connecting the first power signal line corresponding to the first fan-out lead to the power connection bus.

Optionally, n is equal to 4.

Optionally, a ratio of a width of the power connection bus to a maximum width of the first fan-out lead ranges from 0.7 to 1.3.

Optionally, the first fan-out lead includes a first sub-lead and a second sub-lead electrically connected to the first sub-lead; wherein the first sub-lead and the first power signal line are disposed at a same layer, and the second sub-lead and the power connection bus are disposed at a same layer, the first power signal lines and the power connection bus being disposed at different layers.

Optionally, an orthographic projection of the first sub-lead on the substrate falls within an orthographic projection of the second sub-lead on the substrate.

Optionally, two adjacent second fan-out leads are disposed at different layers; and orthographic projections, on the substrate, of the two adjacent second fan-out leads disposed at different layers are staggered.

Optionally, the plurality of second fan-out leads includes a plurality of third sub-leads and a plurality of fourth sub-leads, wherein the plurality of third sub-leads and the plurality of drive signal lines are disposed at a same layer, the plurality of fourth sub-leads and the plurality of drive signal lines are disposed at different layers, the plurality of third sub-leads and the plurality of fourth sub-leads being arranged in a staggered fashion.

Optionally, the display panel further includes an antistatic structure disposed in the non-display region, the antistatic structure being disposed on one side, distal from the power connection bus, of the display region.

Optionally, the display panel further includes a plurality of columns of pixels disposed in the display region, each column of pixels include at least two columns of sub-pixels, the plurality of columns of pixels are in a one-to-one correspondence with the plurality of first power signal lines, and the first power signal line is electrically connected to a plurality of sub-pixels in a corresponding column of pixels; and the plurality of drive signal lines include: a plurality of data signal lines in a one-to-one correspondence with a plurality of columns of sub-pixels in the display panel and a plurality of sense signal lines in a one-to-one correspondence with the plurality of columns of pixels, wherein the data signal line is electrically connected to a plurality of sub-pixels in a corresponding column of sub-pixels; and the sense signal line is electrically connected to a plurality of sub-pixels in a corresponding column of pixels.

Optionally, the display panel further includes a first connection line and a second connection line that are disposed in the display region; wherein the first connection line and the first power signal line are disposed at different layers; and the second connection line and the sense signal line are disposed at different layers; the first power signal line being electrically connected to the plurality of sub-pixels in the corresponding column of pixels via the first connection line, and the sense signal line being electrically connected to the plurality of sub-pixels in the corresponding column of pixels via the second connection line.

Optionally, the display panel further includes a second power signal line disposed in the non-display region, wherein the second power signal line is disposed on one side, proximal to the power connection bus, of the display region, the second power signal line being configured to be electrically connected to the driving chip.

Optionally, the plurality of data signal lines include a plurality of groups of data signal lines, wherein each group of data signal lines include two adjacent data signal lines, and one first power signal line or one sense signal line is disposed between any two adjacent groups of data signal lines.

Optionally, the drive signal line and the power connection bus are disposed at different layers, wherein the drive signal line includes a drive signal line body and a jumper signal line connected to the drive signal line body, an overlapping area exists between an orthographic projection of the jumper signal line on the substrate and an orthographic projection of the power connection bus on the substrate, and a width of the jumper signal line is larger than a width of the drive signal line body.

Optionally, an extension direction of the first power signal line is parallel to an extension direction of the drive signal line, and is perpendicular to an extension direction of the power connection bus.

According to a second aspect, a method for manufacturing a display panel is provided. The method includes:
- providing a substrate, wherein the substrate is provided with a display region and a non-display region disposed at the periphery of the display region; and
- forming a plurality of first power signal lines and a plurality of drive signal lines in the display region, and forming a power connection bus, a plurality of first fan-out leads and a plurality of second fan-out leads in the non-display region, wherein
- the power connection bus is electrically connected to the first power signal line and the first fan-out lead respectively; the plurality of second fan-out leads are electrically connected to the plurality of drive signal lines in a one-to-one correspondence; each first fan-out lead is disposed between every two adjacent second fan-out leads; and the plurality of first fan-out leads and the plurality of second fan-out leads are both configured to be electrically connected to a driving chip.

According to a third aspect, a display device is provided. The display device includes:
- a driving chip and the display panel as described above, wherein
- the driving chip is electrically connected to the plurality of first fan-out leads and the plurality of second fan-out leads in the display panel.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may derive other drawings from these accompanying drawings without creative efforts.

DETAILED DESCRIPTION

For clearer descriptions of the objectives, technical solutions, and advantages of the present disclosure, embodiments of the present disclosure are described in detail hereinafter with reference to the accompanying drawings.

Figure 1:
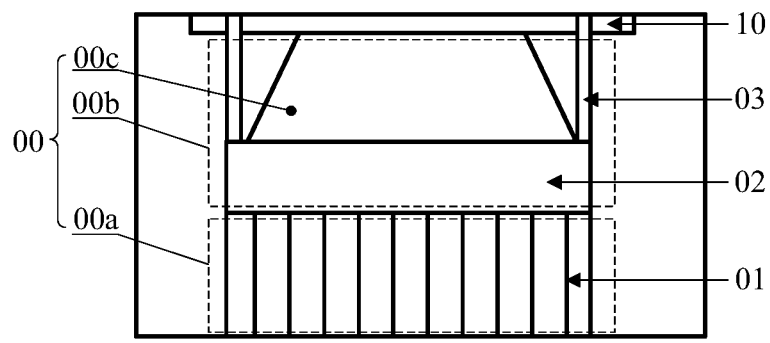
FIG. 1 is a schematic structural diagram of a display device according to the related art.

In the related art, referring to FIG. 1, which is a schematic structural diagram of a display device according to the related art. The display device includes a display panel 00 and a driving chip 10. The display panel 00 is provided with a display region 00a and a non-display region 00b. The display panel 00 includes:
- a plurality of sub-pixels (not shown), a plurality of power signal lines 01 (thick solid lines in the figure), and a plurality of drive signal lines (not shown) that are disposed in the display region 00a, wherein the plurality of power signal lines 01 and the plurality of drive signal lines are connected to the plurality of sub-pixels, and; and
- a power connection bus 02, two first leads 03, and a plurality of second leads (not shown) that are disposed in the non-display region 00b.

The plurality of second leads are electrically connected to the plurality of drive signal lines in a one-to-one correspondence, a region where the plurality of second leads are disposed may also be referred to as a fan-out region 00c, and each of the plurality of second leads is electrically connected to the driving chip 10. The power connection bus 02 is electrically connected to the power signal line 01 and the first lead 03 respectively, the two first leads 03 are respectively disposed on two sides of the fan-out region 00c, and the two first leads 03 are electrically connected to the driving chip 10. In this way, the driving chip 10 can apply a power signal to the plurality of power signal lines 01 via the two first leads 03 and the power connection bus 02 and apply a drive signal to the plurality of drive signal lines via the plurality of second leads, so as to control the sub-pixels that are connected to the plurality of power signal lines 01 and the plurality of drive signal lines for display by the display panel.

In the related art, the power connection bus 02 is electrically connected to the driving chip 10 only via the two first leads 03, and therefore the power connection bus 02 needs to carry a large current. In this way, a width of the power connection bus 02 is large, which results in a larger width of the non-display region 00b in the display panel 00, and further results in a larger width of the frame of the display panel 00. Thus, a screen-to-body ratio of a display device prepared by using the display panel 00 is low, thus affecting the display effect of the display device.

Figure 2:
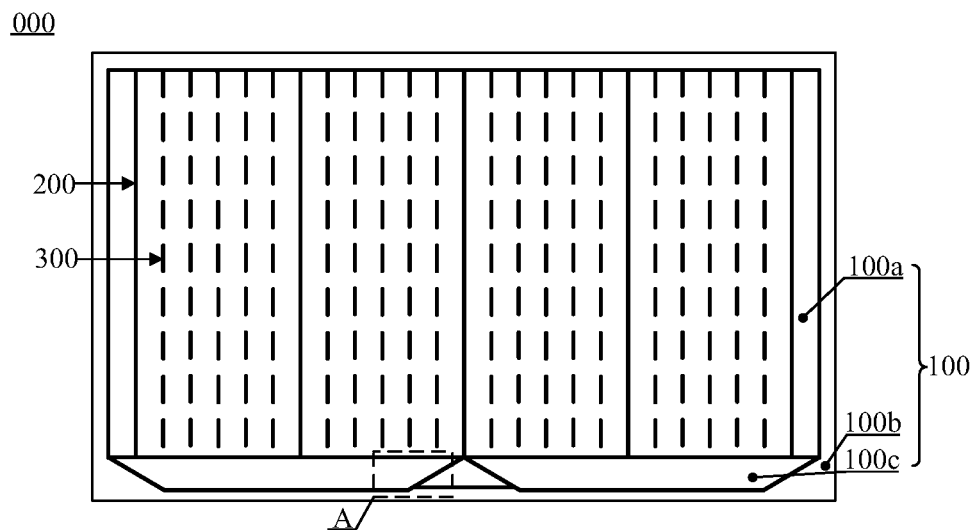
FIG. 2 is a schematic structural diagram of a display panel according to an embodiment of the present disclosure.

Referring to FIG. 2, FIG. 2 is a schematic structural diagram of a display panel according to an embodiment of the present disclosure. The display panel 000 may be an organic light-emitting display (OLED) panel, an active matrix organic light-emitting diode (AM-OLED) display panel or a liquid crystal display panel. In the case where the display panel 000 is an OLED display panel or an AM-OLED display panel, the display panel 000 may be a top-emission display panel or a bottom-emission display panel.

Figure 3:
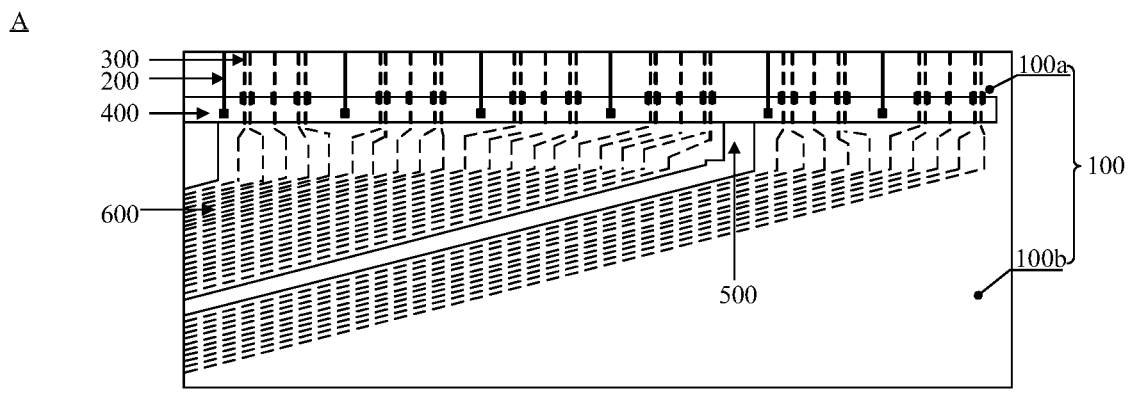
FIG. 3 is a partially enlarged view of the display panel shown in FIG. 2 at A.

The display panel 000 includes a substrate 100, wherein the substrate 100 is provided with a display region 100a and a non-display region 100b disposed at a periphery of the display region 100a. To show the structure of the non-display region 100b more clearly, referring to FIG. 3, which is a partially enlarged view of the display panel shown in FIG. 2 at A.

The display panel 000 further includes a plurality of first power signal lines 200 (thick solid lines in the figure) and a plurality of drive signal lines 300 (thick dashed lines in the figure) that are disposed in the display region 100a, and a power connection bus 400, a plurality of first fan-out leads 500 (thin solid lines in the figure) and a plurality of second fan-out leads 600 (thin dashed lines in the figure) that are disposed in the non-display region 100b.

The power connection bus 400 is electrically connected to the first power signal line 200 and the first fan-out lead 500 respectively, the plurality of second fan-out leads 600 are electrically connected to the plurality of drive signal lines 300 in a one-to-one correspondence, and any one of the plurality of first fan-out leads 500 is disposed between two adjacent second fan-out leads 600. The plurality of first fan-out leads 500 and the plurality of second fan-out leads 600 are both configured to be electrically connected to a driving chip.

It should be noted that there are usually several hundred or thousand fan-out leads 500 and second fan-out leads 600 in the display panel 000, and there may be a plurality of second fan-out leads 600 between two adjacent first fan-out leads 500.

In the present disclosure, any one of the first fan-out leads 500 is disposed between two adjacent second fan-out leads 600, and a region in which the plurality of second fan-out leads 600 are disposed may also be referred to as a fan-out region 100c. Therefore, the plurality of first fan-out leads 500 are also disposed in the fan-out region 100c. The power connection bus 400 in the display panel 000 is electrically connected to the driving chip via the plurality of first fan-out leads 500 disposed in the fan-out region 100c. In this way, the current carried by the power connection bus 400 is reduced, such that a width of the power connection bus 400 is reduced, a width of the non-display region 000b in the display panel 000 is reduced, and further a width of the frame of the display panel 000 is reduced, thereby increasing a screen-to-body ratio of the display device prepared by using the display panel 000 and improving the display effect of the display device.

In summary, the display panel according to the embodiment of the present disclosure includes a substrate, a plurality of first power signal lines, a plurality of drive signal lines, a power connection bus, a plurality of first fan-out leads, and a plurality of second fan-out leads. Any one of the first fan-out leads in the display panel is disposed between two adjacent second fan-out leads, and a region in which the plurality of second fan-out leads are disposed may also be referred to as a fan-out region. Therefore, the first fan-out leads are also disposed in the fan-out region, and the power connection bus in the display panel is electrically connected to the driving chip via the plurality of first fan-out leads disposed in the fan-out region. In this way, the current carried by the power connection bus is reduced, such that a width of the power connection bus is reduced, a width of the non-display region in the display panel is reduced, and further a width of the frame of the display panel is reduced, thereby increasing a screen-to-body ratio of the display device prepared by using the display panel and improving the display effect of the display device.

Figure 4:
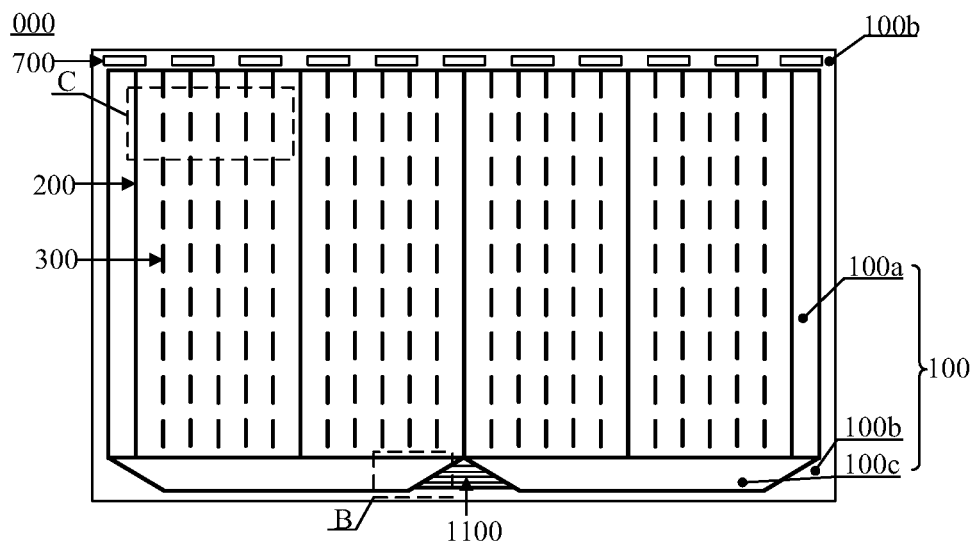
FIG. 4 is a schematic structural diagram of a display panel according to another embodiment of the present disclosure.
Figure 5:
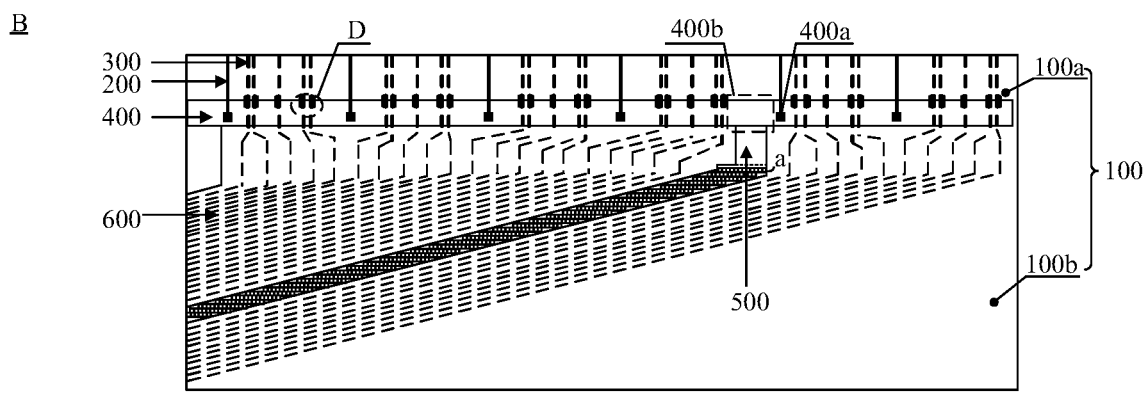
FIG. 5 is a partially enlarged view of the display panel shown in FIG. 4 at B.

In an embodiment of the present disclosure, referring to FIG. 4 and FIG. 5, FIG. 4 is a schematic structural diagram of a display panel according to another embodiment of the present disclosure, and FIG. 5 is a partially enlarged view of the display panel shown in FIG. 4 at B. In the display panel 000, one first fan-out lead 500 corresponds to n first power signal lines 200, wherein n is an integer greater than or equal to 1. The first fan-out lead 500 is configured to apply a first power signal to the n first power signal lines 200 corresponding to the first fan-out lead 500 via the power connection bus 400. In this way, a number of the first fan-out leads 500 disposed in the non-display region 100b is less than a number of the first power signal lines 200 disposed in the display region 100a, that is to say, the number of the first fan-out leads 500 disposed in the non-display region 100b is effectively reduced, thereby further reducing the width of the non-display region 100b in the display panel 000 and increasing the screen-to-body ratio of the display device prepared by using the display panel 000.

Optionally, a connection point for connecting each first fan-out lead 500 to the power connection bus 400 is a first connection point 400a, and a connection point for connecting the first power signal line 200 corresponding to the first fan-out lead 500 to the power connection bus 400 is a second connection point 400b. On the power connection bus 400, a number of the second connection points 400b distributed on a side of each first connection point 400a is equal to a number of the second connection points 400b distributed on another side of the first connection point 400a. In this way, n first power signal lines 200 corresponding to each first fan-out lead 500 are uniformly distributed on two sides of the first fan-out lead 500, such that the first power signal applied by the first fan-out lead 500 to the n first power signal lines 200 corresponding to the first fan-out lead 500 via the power connection bus 400 has a better uniformity.

For example, n may be equal to 4, that is, one first fan-out lead 500 corresponds to four first power signal lines 200.

In the related art, as shown in FIG. 1, as the power connection bus 02 is electrically connected to the driving chip 10 only via two first leads 03, the power connection bus 02 needs to carry a large current. A width of the power connection bus 02 is much larger than that of the first leads 03.

In the present disclosure, the power connection bus 400 can be electrically connected to the driving chip via the plurality of first fan-out leads 500 in the display panel 000. Therefore, the current carried by the power connection bus 400 is equal to that carried by the first fan-out lead 500, and a width of the power connection bus 400 is approximately equal to that of the first fan-out lead 500. A ratio of the width of the power connection bus 400 to a maximum width of the first fan-out lead 500 ranges from 0.7 to 1.3. In other words, the width of the power connection bus 400 in the present disclosure is less than that of the power connection bus 02 in the related art.

In the present disclosure, a number of the second fan-out leads 600 between any two adjacent first fan-out leads 500 are the same in the fan-out region in the non-display region 000b of the display panel 000.

Figure 6:
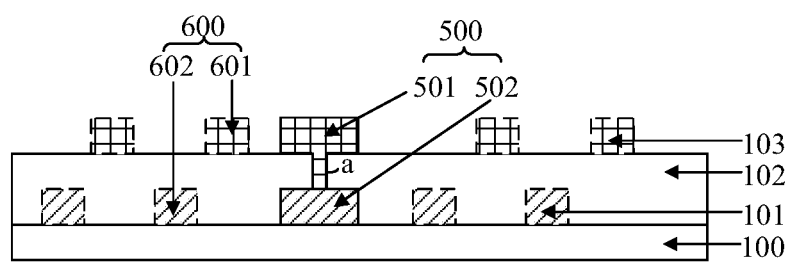
FIG. 6 is a schematic structural diagram of films of the display panel shown in FIG. 4.

In the embodiment of the present disclosure, referring to FIG. 4 and FIG. 6, FIG. 6 is a schematic structural diagram of films of the display panel shown in FIG. 4. In the display panel 000, the first power signal line 200 and the power connection bus 400 are disposed at different layers. The first fan-out lead 500 in the display panel 000 includes a first sub-lead 501 and a second sub-lead 502 electrically connected to the first sub-lead 501. The first sub-lead 501 and the first power signal line 200 are disposed at a same layer, and the second sub-lead 502 and the power connection bus 400 are disposed at a same layer. In this way, a cross-sectional area of the first fan-out lead 500 can be enlarged by disposing the first sub-lead 501 and the second sub-lead 502 connected to the first sub-lead 501 at different layers, such that the first fan-out lead 500 has a higher current carrying capability.

For example, the first sub-lead 501 is made of the same material as the first power signal line 200, such that the first sub-lead 501 and the first power signal line 200 can be formed by one same patterning process; and the second sub-lead 502 is made of the same material as the power connection bus 400, such that the second sub-lead 502 and the power connection bus 400 can also be formed by one same patterning process. As shown in FIG. 6, the display panel 000 further includes a first conductive layer 101, an insulation layer 102, and a second conductive layer 103. The first conductive layer 101, insulation layer 102 and second conductive layer 103 are disposed on a substrate 100 and are stacked in a direction perpendicular to and distal from the substrate 100. The second sub-lead 502 is included in the first conductive layer 101. The first sub-lead 501 is included in the second conductive layer 103. The insulation layer 102 is provided with a via hole a, such that the first sub-lead 501 in the second conductive layer 103 can be electrically connected to a second sub-lead 502 in the first conductive layer 101 via the via hole a.

Optionally, as shown in FIG. 6, an orthographic projection of the first sub-lead 501 on the substrate 100 falls within an orthographic projection of the second sub-lead 502 on the substrate 100. In this way, the width of the first fan-out lead 500 is reduced, and the width of the non-display region 100b in the display panel 000 is further reduced, thereby increasing the screen-to-body ratio of the display device prepared by using the display panel 000.

In the embodiment of the present disclosure, any two adjacent second fan-out leads 600 in the plurality of second fan-out leads 600 are disposed at different layers, and orthographic projections, on the substrate 100, of any two adjacent second fan-out leads 600 disposed at different layers are staggered. In this way, a distance between the second fan-out leads 600 disposed in the non-display region 100b can be reduced, the width of the non-display region 100b in the display panel 000 is further reduced. A manufacturing difficulty of the second fan-out leads 600 is lowered as the distance between the second fan-out leads 600 is increased. In addition, because orthographic projections, on the substrate 100, of two adjacent second fan-out leads 600 disposed at different layers are staggered, the overlap between the two adjacent second fan-out leads 600 is avoided. Thus, a capacitance value of a parasitic capacitance generated between the two adjacent second fan-out leads 600 is reduced, thereby reducing the degree of influence of the parasitic capacitance on the display effect of the display panel 000.

Optionally, as shown in FIG. 6, the second fan-out leads 600 in the display panel 000 includes a plurality of third sub-leads 601 and a plurality of fourth sub-leads 602. The plurality of third sub-leads 601 and the plurality of drive signal lines 300 are disposed at a same layer and the plurality of fourth sub-leads 602 and the plurality of drive signal lines 300 are disposed at different layers, wherein the plurality of third sub-leads 601 and the plurality of fourth sub-leads 602 are arranged in a staggered fashion. In this way, any two adjacent second fan-out leads 600 disposed in the non-display region 100b may be disposed at different layers. For example, the third sub-lead 601 is made of the same material as the first sub-lead 501 and the first power signal line 200, such that the third sub-lead 601, the first sub-lead 501 and the first power signal line 200 can be formed by one same patterning process; and the fourth sub-lead 602 is made of the same material as the second sub-lead 502 and the power connection bus 400, such that the fourth sub-lead 602, the second sub-lead 502 and the power connection bus 400 can be formed by one same patterning process. For example, the fourth sub-lead 602 is included in the first conductive layer 101; and the third sub-lead 601 is included in the second conductive layer 103.

Figure 7:
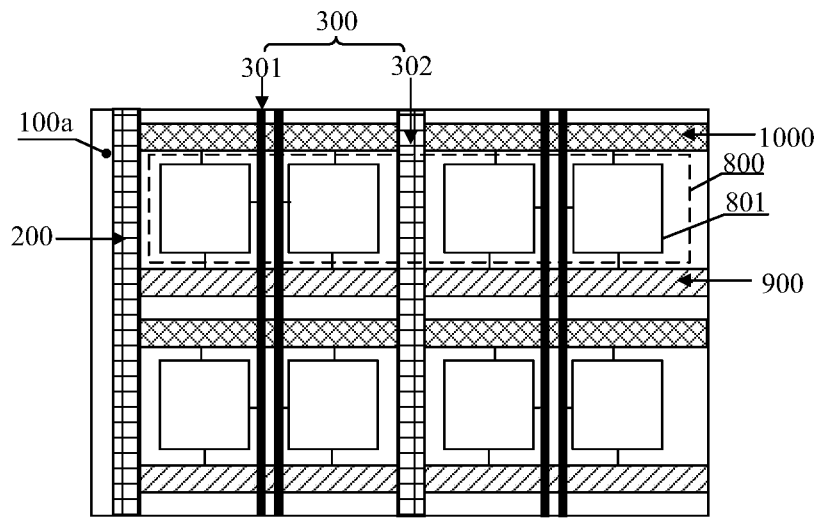
FIG. 7 is a partially enlarged view of the display panel shown in FIG. 4 at C.

In the present disclosure, referring to FIG. 7, which is a partially enlarged view of the display panel shown in FIG. 4 at C. The display panel 000 further include a plurality of columns of pixels 800 disposed in the display region 100a. Each pixel 800 is composed of at least two sub-pixels 801 arranged continuously, and thus each column of pixels 800 may include at least two columns of sub-pixels 801. The plurality of columns of pixels 800 are in a one-to-one correspondence with the plurality of first power signal lines 200, and the first power signal line 200 is electrically connected to a plurality of sub-pixels 801 in the column of pixels 800 corresponding to the first power signal line 200. For example, the plurality of sub-pixels 801 in each pixel 800 includes at least two of a red sub-pixel, a blue sub-pixel, a green sub-pixel, or a white sub-pixel. The embodiment of the present disclosure is schematically described by taking a fact that each pixel 800 includes a red sub-pixel, a blue sub-pixel, a green sub-pixel, and a white sub-pixel as an example.

The plurality of drive signal lines 300 in the display panel 000 may include a plurality of data signal lines 301 and a plurality of sense signal lines 302, wherein the plurality of data signal lines 301 is in a one-to-one correspondence with the plurality of columns of sub-pixels 801 in the display panel 000, and the plurality of sense signal lines 302 is in a one-to-one correspondence with the plurality of columns of pixels 800. The data signal line 301 is electrically connected to a plurality of sub-pixels in the column of sub-pixels 801 corresponding to the data signal line 301. The sense signal line 302 is electrically connected to a plurality of sub-pixels in the column of pixels 800 corresponding to the sense signal line 302.

For example, as shown in FIG. 4 and FIG. 7, the plurality of data signal lines 301 includes a plurality of groups of data signal lines 301, one group of data signal lines 301 include two adjacent data signal lines 301, and one first power signal line 200 or one sense signal line 302 may be arranged between any two adjacent groups of data signal lines 301.

In the embodiment of the present disclosure, referring to FIG. 4, the display panel 000 further includes a second power signal line 1100 disposed in the non-display region 100*b*; and the second power signal line 1100 is disposed on one side, proximal to the power connection bus 400, of the display region 100*a*. The second power signal line 1100 is configured to be electrically connected to the driving chip. In this way, the second power signal line 1100 may be connected to a same driving chip with the first fan-out lead 500 and the second fan-out lead 600, such that there is no need to provide another driving chip in another region of the display panel 000, and thus a width of the other non-display region around the display panel 000 can be reduced, thereby reducing a width of an entire frame of the display panel 000.

For example, the second power signal line 1100 and the power connection bus 400 are disposed at a same layer. For example, the power connection bus 400 is made of the same material as the second power signal line 1100, such that the second power signal line 1100 and the power connection bus 400 can also be formed by one same patterning process.

Figure 8:
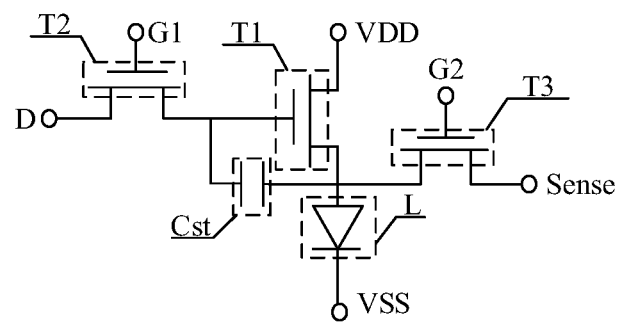
FIG. 8 is a schematic diagram of a pixel drive circuit according to an embodiment of the present disclosure.

In the embodiment of the present disclosure, each sub-pixel 801 in the display panel 000 includes a pixel driving circuit and a light-emitting device. For example, the light-emitting device may be an OLED light-emitting device. The OLED light-emitting device may include an anode, a light-emitting layer, and a cathode that are laminated. As shown in FIG. 8, FIG. 8 is a schematic diagram of a pixel drive circuit according to an embodiment of the present disclosure. The pixel drive circuit includes a first thin-film transistor T1, a second thin-film transistor T2, a third thin-film transistor T3, and a storage capacitor Cst.

The pixel drive circuit has an input terminal D, a first gate scanning input terminal G1, a second gate scanning input terminal G2, a first power terminal VDD, a second power terminal VSS, and a sense signal terminal Sense. The input terminal D is electrically connected to a data signal line 301; the first gate scanning input terminal G1 and the second gate scanning input terminal G2 are electrically connected to two gate lines in the display panel, respectively; the first power terminal VDD is electrically connected to the first power signal line 200; the second power terminal VSS is electrically connected to the second power signal line 1100; and the sense signal terminal Sense is electrically connected to the sense signal line 302.

Each thin-film transistor may include a first electrode, a second electrode, and a gate. The first electrode is one of a source and a drain, and the second electrode is the other of the source and the drain. A first electrode of the first thin-film transistor T1 is electrically connected to the first power terminal VDD; a second electrode of the first thin-film transistor T1 is electrically connected to the anode of an OLED light-emitting device L; and a gate of the first thin-film transistor T1 is electrically connected to a first electrode of the second thin-film transistor T2. A second electrode of the second thin-film transistor T2 is electrically connected to the input terminal D; and a gate of the second thin-film transistor T2 is electrically connected to the first gate scanning input terminal G1. A first electrode of the third thin-film transistor T3 is electrically connected to the anode of the OLED light-emitting device L; a second electrode of the third thin-film transistor T3 is electrically connected to the sense signal terminal Sense; and a gate of the third thin-film transistor T3 is electrically connected to the second gate scanning input terminal G2. One end of the storage capacitor Cst is electrically connected to the first electrode of the second thin-film transistor T2, and the other end is electrically connected to the anode of the OLED light-emitting device L. The cathode of the OLED light-emitting device L is electrically connected to the second power terminal VSS.

Optionally, a thin-film transistor in each pixel drive circuit may be a top-gate thin-film transistor, a bottom-gate thin-film transistor, a back channel-etched (BCE) thin-film transistor or an etch stop layer (ESL) thin-film transistor.

In the embodiment of the present disclosure, the thin-film transistor in the pixel drive circuit needs to be shielded by a conductive light-shielding layer, so as to avoid a shift of a voltage threshold value of an active layer in the thin-film transistor under irradiation of light.

Optionally, a material of the conductive light-shielding layer may include a metal material such as metal aluminum, metal silver, metal molybdenum, or alloy.

In the present disclosure, as shown in FIG. 7, the display panel 000 further includes a first connection line 900 and a second connection line 1000 that are disposed in the display region 100*a*. The first connection line 900 and the first power signal line 200 are disposed at different layers, and the second connection line 1000 and the sense signal line 302 are disposed at different layers. The first power signal line 200 is electrically connected to a plurality of sub-pixels 801 in a corresponding column of pixels 800 via the first connection line 900, and the sense signal line 302 is electrically connected to a plurality of sub-pixels 801 in a corresponding column of pixels 800 via the second connection line 1000.

For example, the first connection line 900 and the power connection bus 400 are disposed at a same layer, and the second connection line 1000 and the conductive light-shielding layer are disposed at a same layer. For example, the first connection line 900 is made of the same material as the power connection bus 400, such that the first connection line 900 and the power connection bus 400 can also be formed by one same patterning process; and the second connection line 1000 is made of the same material as the conductive light-shielding layer, such that the second connection line 1000 and the conductive light-shielding layer can be formed by one same patterning process.

In the embodiment of the present disclosure, referring to FIG. 4, the display panel 000 further includes an antistatic structure 700 disposed in the non-display region 100*b*, and the antistatic structure 700 is disposed on one side, distal from the power connection bus 400, of the display region 100*a*. In this way, the antistatic structure 700 and the power connection bus 400 are respectively disposed on two sides of the display region 100*a* in the display panel 000, and a width of a side, in which the power connection bus 400 is disposed, of the non-display region 100*b* is further reduced, thereby reducing a width of a side, in which the power connection bus 400 is disposed, of a frame of the display panel 000.

Figure 9:
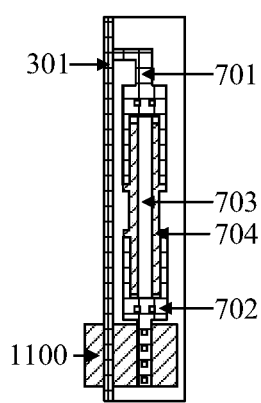
FIG. 9 is a schematic structural diagram of an antistatic structure according to an embodiment of the present disclosure.

For example, referring to FIG. 9, FIG. 9 is a schematic structural diagram of an antistatic structure according to an embodiment of the present disclosure. The antistatic structure 700 may be an electro-static discharge (ESD) diode. The antistatic structure 700 may include a plurality of ESD diodes in a one-to-one correspondence with a plurality of columns of sub-pixels 801, and each of the ESD diodes 700 may include a first electrode 701, a second electrode 702, an active layer 703, and a third electrode 704. The first electrode 701 and the second electrode 702 are disposed at a same layer, the first electrode 701 and the active layer 703 are disposed at different layers, and the active layer 703 and the third electrode 704 are disposed at different layers. The first electrode 701 is electrically connected to a data signal line 301 corresponding to a corresponding column of sub-pixels 801, the second electrode 702 is electrically connected to a second power signal line 1100, and both the first electrode 701 and the second electrode 702 are electrically connected to the active layer 703.

When static electricity is generated during use of the display panel 000, an electrostatic charge is transferred to the first electrode 701 in the ESD diode 700 via the data signal line 301, such that a coupling capacitance is generated between the first electrode 701 and the third electrode 704. When accumulated charges on the third electrode 701 reach an on-current value of the ESD diode, the third electrode 704 may turn on the active layer 703 to discharge the accumulated electrostatic charges to the second power signal line 1100 via the second electrode 702, such that the electrostatic charges generated in the display panel 000 are discharged and the display panel 000 is protected.

For example, the first electrode 701 and the second electrode 702 are disposed at a same layer as a drive signal line 300, and the third electrode 704 and the second power signal line 1100 are disposed at a same layer. For example, the first electrode 701 and the second electrode 702 are made of the same material as the drive signal line 300, such that the first electrode 701, the second electrode 702 and the drive signal line 300 can be formed by one same patterning process; and the third electrode 704 is made of the same material as the second power signal line 1100, such that the third electrode 704 and the second power signal line 1100 can be formed by one same patterning process.

Figure 10:
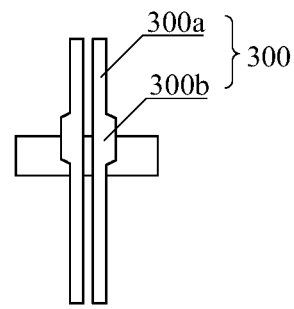
FIG. 10 is a partially enlarged view of the display panel shown in FIG. 5 at D.

In an embodiment of the present disclosure, please refer to FIG. 10, which is a partially enlarged view of the display panel shown in FIG. 5 at D. The drive signal line 300 and the power connection bus 400 are disposed at different layers. The drive signal line 300 includes a drive signal line body 300a and a jumper signal line 300b connected to the drive signal line body 300a. An overlapping area exists between an orthographic projection of the jumper signal line 300b on the substrate 100 and an orthographic projection of the power connection bus 400 on the substrate 100, and a width of the jumper signal line 300b is larger than a width of the drive signal line body 300a. Thus, when the width of the jumper signal line 300b in the drive signal line 300 for overlapping with the power connection bus 400 is larger, a risk of disconnection at the overlap of the drive signal line 300 and the power connection bus 400 can be effectively reduced.

Optionally, referring to FIG. 5, an extension direction of the first power signal line 200 in the display panel 000 is parallel to an extension direction of the drive signal line 300 and is perpendicular to an extension direction of the power connection bus 400, which facilitates the design and manufacture of the display panel 000, and avoids a short circuit between the first power signal line 200 and the drive signal line 300. In addition, the first power signal line 200 can be electrically connected to the power connection bus 400 easily.

It should be noted that one patterning process in the above embodiments may include photoresist coating, exposure, development, etching, and photoresist stripping.

In summary, the display panel according to the embodiment of the present disclosure includes a substrate, a plurality of first power signal lines, a plurality of drive signal lines, a power connection bus, a plurality of first fan-out leads, and a plurality of second fan-out leads. Any one of the first fan-out leads in the display panel is disposed between two adjacent second fan-out leads, and a region in which the plurality of second fan-out leads are disposed may also be referred to as a fan-out region. Therefore, the first fan-out leads are also disposed in the fan-out region, and the power connection bus in the display panel is electrically connected to the driving chip via the plurality of first fan-out leads disposed in the fan-out region. In this way, the current carried by the power connection bus is reduced, such that a width of the power connection bus is reduced, a width of the non-display region in the display panel is reduced, and further a width of the frame of the display panel is reduced, thereby increasing a screen-to-body ratio of the display device prepared by using the display panel and improving the display effect of the display device.

An embodiment of the present disclosure further provides a method for manufacturing a display panel. The method for manufacturing the display panel is used for manufacturing the display panel shown in FIG. 2. The method for manufacturing the display panel may include the following steps.

In step A1, a substrate is provided, wherein the substrate is provided with a display region and a non-display region disposed at a periphery of the display region.

In step A2, a plurality of first power signal lines and a plurality of drive signal lines are formed in the display region, and a power connection bus, a plurality of first fan-out leads and a plurality of second fan-out leads are formed in the non-display region.

The power connection bus is electrically connected to the first power signal line and the first fan-out lead respectively; the plurality of second fan-out leads are electrically connected to the plurality of drive signal lines in a one-to-one correspondence; any one of the first fan-out leads is disposed between two adjacent second fan-out leads; and the plurality of first fan-out leads and the plurality of second fan-out leads are both configured to be electrically connected to a driving chip.

A person skilled in the art may clearly understand that, for convenience and conciseness of description, for the specific principle of the display panel described above, reference may be made to the corresponding content in the foregoing embodiment of the structure of the display device. Details are not described herein again.

In summary, according to the method for manufacturing a display panel in the embodiment of the present disclosure, any one of the first fan-out leads in the display panel is disposed between two adjacent second fan-out leads, and a region in which the plurality of second fan-out leads are disposed may also be referred to as a fan-out region. Therefore, the first fan-out leads are also disposed in the fan-out region, and the power connection bus in the display panel is electrically connected to the driving chip via the plurality of first fan-out leads disposed in the fan-out region. In this way, the current carried by the power connection bus is reduced, such that a width of the power connection bus is reduced, a width of the non-display region in the display panel is reduced, and further a width of the frame of the display panel is reduced, thereby increasing a screen-tobody ratio of the display device prepared by using the display panel and improving the display effect of the display device.

Figure 11:
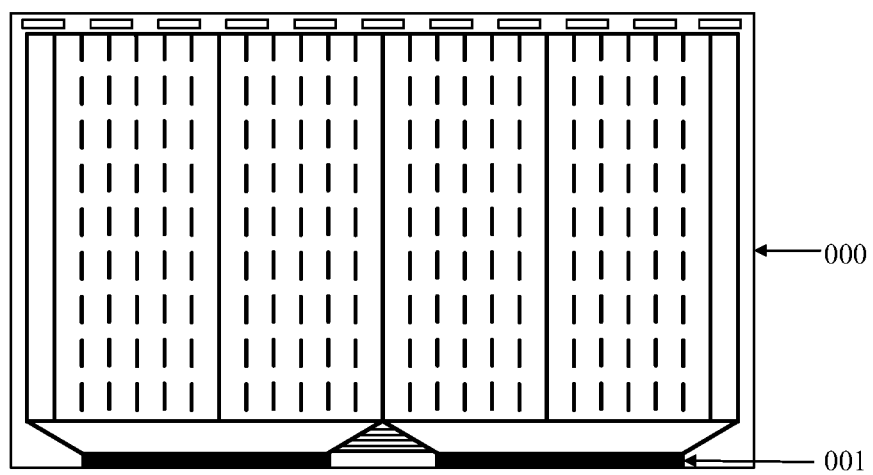
FIG. 11 is a schematic structural diagram of a display device according to an embodiment of the present disclosure.

An embodiment of the present disclosure further provides a display device. The display device may be any product or component having a display function such as a mobile phone, a tablet computer, a television set, a display, a notebook computer, a digital photo frame, a navigator, or the like. For example, as shown in FIG. 11, FIG. 11 is a schematic structural diagram of a display device according to an embodiment of the present disclosure. The display device 010 includes a driving chip 001 and a display panel 000. The display panel 000 may be the display panel in the embodiments described above. The driving chip 001 is electrically connected to the plurality of first fan-out leads and the plurality of second fan-out leads in the display panel 000. The driving chip 001 may also be electrically connected to the second power signal line. In the display device 010 provided in the embodiment of the present disclosure, there are two driving chips 001. In another possible embodiment, there may be one or more driving chips 001, which is not limited in the embodiment of the present disclosure.

Figure 12:
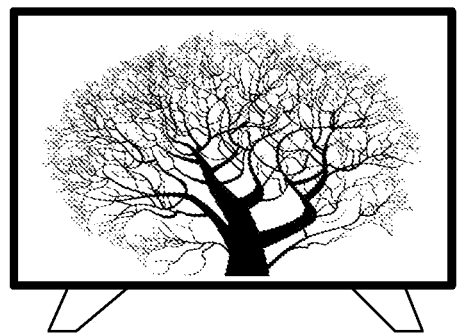
FIG. 12 is an effect diagram of a display device according to the related art.
Figure 13:
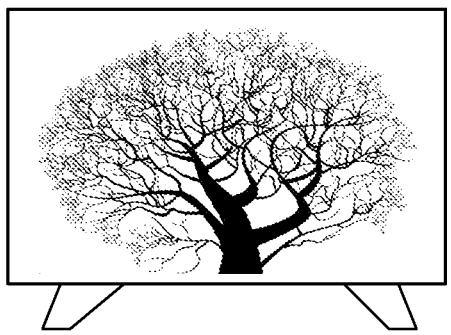
FIG. 13 is an effect diagram of a display device according to an embodiment of the present disclosure.

When the display device is a television, referring to FIG. 12 and FIG. 13. FIG. 12 is an effect diagram of a display device 020 according to the related art; and FIG. 13 is an effect diagram of a display device according to an embodiment of the present disclosure. Compared with the related art, a width of the frame of the display device 010 provided in the embodiment of the present disclosure is smaller. In the related art, a width of the frame of the display device 020 is 10 mm. In the embodiment of the present disclosure, the width of the frame of the display device 010 is 5 mm. Compared with the related art, the width of the frame of the display device 010 provided in the embodiment of the present disclosure is reduced by 50%, thereby effectively improving the display effect of the display device 010.

Figure 14:
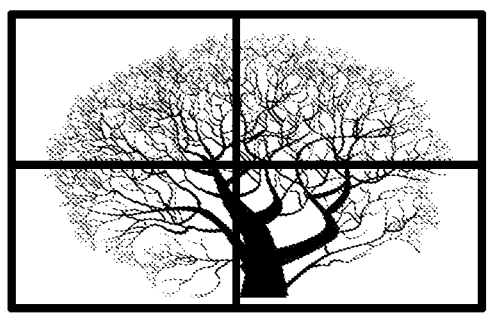
FIG. 14 is an effect diagram of a splicing screen according to the related art.
Figure 15:
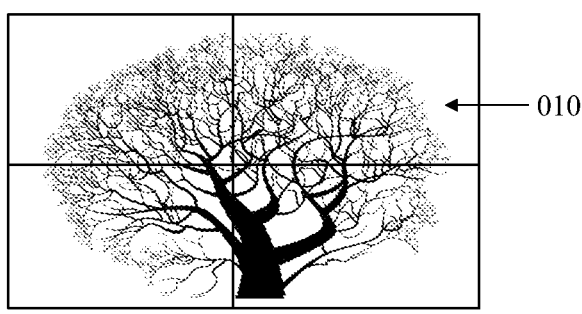
FIG. 15 is an effect diagram of a splicing screen according to an embodiment of the present disclosure.

An embodiment of the present disclosure further provides a splicing screen. The splicing screen may include a plurality of display devices 010 shown in FIG. 11. For example, referring to FIG. 14 and FIG. 15, FIG. 14 is an effect diagram of a splicing screen according to the related art, and FIG. 15 is an effect diagram of a splicing screen according to an embodiment of the present disclosure. The splicing screen according to the embodiment of the present disclosure is composed of a plurality of display devices 010 shown in FIG. 10, and a width of the frame of the display device 010 is small. Therefore, compared with the related art, a width of a splicing seam between any two adjacent display devices of the splicing screen according to the embodiment of the present disclosure is smaller, thereby improving the display effect of the splicing screen.

It should be noted that in the drawings, dimensions of a layer and a region may be exaggerated for clarity of illustration. It may also be understood that when an element or a layer is above another element or layer, it may be directly on another element, or there may be an intermediate layer. In addition, it may be understood that when an element or a layer is below another element or layer, it may be directly under another element or there may be more than one intermediate layer or element. In addition, it may be also understood that when a layer or an element is between two layers or two elements, the layer may be a unique layer between two layers or between two elements, or there may be more than one intermediate layer or element. Similar reference numerals throughout the present disclosure indicate similar elements.

In the present disclosure, the terms "first" and "second" are merely intended for a purpose of description, and shall not be understood as an indication or implication of relative importance. The term "a plurality of" means two or more than two unless otherwise specified.

The foregoing descriptions are merely optional embodiments of the present disclosure, but are not intended to limit the present disclosure. Any modification, equivalent replacement, improvement, or the like made without departing from the spirit and principle of the present disclosure shall fall within the protection scope of the present disclosure.

What is claimed is:

1. A display panel, comprising:
    a substrate provided with a display region and a non-display region disposed at a periphery of the display region;
    a plurality of first power signal lines and a plurality of drive signal lines that are disposed in the display region; and
    a power connection bus, a plurality of first fan-out leads, and a plurality of second fan-out leads that are disposed in the non-display region, wherein
    the power connection bus is electrically connected to the plurality of first power signa lines and the plurality of first fan-out leads respectively; the plurality of second fan-out leads are electrically connected to the plurality of drive signal lines in a one-to-one correspondence; each first fan-out lead is disposed between every two adjacent second fan-out leads; and the plurality of first fan-out leads and the plurality of second fan-out leads are both configured to be electrically connected to a driving chip,
    wherein an extension direction of each first power signal line is parallel to an extension direction of each drive signal line, and is perpendicular to an extension direction of the power connection bus.

2. The display panel according to claim 1, wherein n first power signal lines correspond to one first fan-out lead of the plurality of first fan-out leads, and the one first fan-out lead is configured to apply a first power signal to the n first power signal lines corresponding to the one first fan-out lead via the power connection bus, wherein n is an integer greater than or equal to 1.

3. The display panel according to claim 2, wherein on the power connection bus, a number of second connection points distributed on a side of a first connection point is equal to a number of second connection points distributed on another side of the first connection point, wherein the first connection point is a connection point for connecting the one first fan-out lead of the plurality of first fan-out leads to the power connection bus; and the second connection point is a connection point for connecting the n first power signal lines corresponding to the one first fan-out lead of the plurality of first fan-out leads to the power connection bus.

4. The display panel according to claim 3, wherein n is equal to 4.

5. The display panel according to claim 1, wherein a ratio of a width of the power connection bus to a width of the widest fan-out lead of the plurality of first fan-out leads ranges from 0.7 to 1.3.

6. The display panel according to claim 1, wherein each first fan-out lead comprises a first sub-lead and a second sub-lead electrically connected to the first sub-lead; wherein the first sub-lead and the plurality of first power signal lines are disposed at a same layer, and the second sub-lead and the power connection bus are disposed at a same layer, the plurality of first power signal lines and the power connection bus being disposed at different layers.

7. The display panel according to claim 6, wherein an orthographic projection of the first sub-lead on the substrate falls within an orthographic projection of the second sub-lead on the substrate.

8. The display panel according to claim 1, wherein two adjacent second fan-out leads are disposed at different layers; and orthographic projections, on the substrate, of the two adjacent second fan-out leads disposed at different layers are staggered.

9. The display panel according to claim 8, wherein the plurality of second fan-out leads comprise a plurality of third sub-leads and a plurality of fourth sub-leads, wherein the plurality of third sub-leads and the plurality of drive signal lines are disposed at a same layer, the plurality of fourth sub-leads and the plurality of drive signal lines are disposed at different layers, the plurality of third sub-leads and the plurality of fourth sub-leads being arranged in a staggered fashion.

10. The display panel according to claim 1, wherein the display panel further comprises an antistatic structure disposed in the non-display region, the antistatic structure being disposed on one side, distal from the power connection bus, of the display region.

11. The display panel according to claim 1, wherein
the display panel further comprises a plurality of columns of pixels disposed in the display region, each column of pixels comprise at least two columns of sub-pixels, the plurality of columns of pixels are in a one-to-one correspondence with the plurality of first power signal lines, and each first power signal line is electrically connected to a plurality of sub-pixels in a corresponding column of pixels; and
the plurality of drive signal lines comprise: a plurality of data signal lines in a one-to-one correspondence with a plurality of columns of sub-pixels in the display panel and a plurality of sense signal lines in a one-to-one correspondence with the plurality of columns of pixels, wherein each data signal line is electrically connected to a plurality of sub-pixels in a corresponding column of sub-pixels, and each sense signal line is electrically connected to a plurality of sub-pixels in a corresponding column of pixels.

12. The display panel according to claim 11, wherein the display panel further comprises a first connection line and a second connection line that are disposed in the display region; wherein the first connection line and the plurality of first power signal lines are disposed at different layers; and the second connection line and the plurality of sense signal lines are disposed at different layers; each first power signal line being electrically connected to the plurality of sub-pixels in the corresponding column of pixels via the first connection line, and each sense signal line being electrically connected to the plurality of sub-pixels in the corresponding column of pixels via the second connection line.

13. The display panel according to claim 1, wherein the display panel further comprises a second power signal line disposed in the non-display region, wherein the second power signal line is disposed on one side, proximal to the power connection bus, of the display region, the second power signal line being configured to be electrically connected to the driving chip.

14. The display panel according to claim 1, wherein the plurality of data signal lines comprise a plurality of groups of data signal lines, wherein each group of data signal lines comprise two adjacent data signal lines, and one first power signal line or one sense signal line is disposed between any two adjacent groups of data signal lines.

15. The display panel according to claim 1, wherein the plurality of drive signal lines and the power connection bus are disposed at different layers, wherein each drive signal line comprises a drive signal line body and a jumper signal line connected to the drive signal line body, an overlapping area exists between an orthographic projection of the jumper signal line on the substrate and an orthographic projection of the power connection bus on the substrate, and a width of the jumper signal line is larger than a width of the drive signal line body.

16. A method for manufacturing a display panel, comprising:
providing a substrate, wherein the substrate is provided with a display region and a non-display region disposed at a periphery of the display region; and
forming a plurality of first power signal lines and a plurality of drive signal lines in the display region, and forming a power connection bus, a plurality of first fan-out leads and a plurality of second fan-out leads in the non-display region, wherein
the power connection bus is electrically connected to the plurality of first power signal lines and the plurality of first fan-out leads respectively; the plurality of second fan-out leads are electrically connected to the plurality of drive signal lines in a one-to-one correspondence; each first fan-out lead is disposed between every two adjacent second fan-out leads; and the plurality of first fan-out leads and the plurality of second fan-out leads are both configured to be electrically connected to a driving chip,
wherein an extension direction of each first power signal line is parallel to an extension direction of each drive signal line, and is perpendicular to an extension direction of the power connection bus.

17. A display device, comprising: a driving chip and a display panel, wherein
the display panel comprises:
a substrate provided with a display region and a non-display region disposed at a periphery of the display region;
a plurality of first power signal lines and a plurality of drive signal lines that are disposed in the display region; and
a power connection bus, a plurality of first fan-out leads, and a plurality of second fan-out leads that are disposed in the non-display region, wherein
the power connection bus is electrically connected to the plurality of first power signal lines and the plurality of first fan-out leads respectively; the plurality of second fan-out leads are electrically connected to the plurality of drive signal lines in a one-to-one correspondence; each first fan-out lead is disposed between every two adjacent second fan-out leads; and
the driving chip is electrically connected to the plurality of first fan-out leads and the plurality of second fan-out leads in the display panel,
wherein an extension direction of each first power signal line is parallel to an extension direction of each drive signal line, and is perpendicular to an extension direction of the power connection bus.

18. The display device according to claim 17, wherein n first power signal lines correspond to one first fan-out lead of the plurality of first fan-out leads, and the one first fan-out lead is configured to apply a first power signal to the n first power signal lines corresponding to the one first fan-out lead via the power connection bus, wherein n is an integer greater than or equal to 1.

19. The display device according to claim 17, wherein a ratio of a width of the power connection bus to a width of the widest fan-out lead the plurality of first fan-out leads ranges from 0.7 to 1.3.

* * * * *

UNITED STATES PATENT AND TRADEMARK OFFICE
CERTIFICATE OF CORRECTION

| | | |
|---|---|---|
| PATENT NO. | : 12,408,521 B2 | Page 1 of 1 |
| APPLICATION NO. | : 17/613691 | |
| DATED | : September 2, 2025 | |
| INVENTOR(S) | : Guoying Wang et al. | |

It is certified that error appears in the above-identified patent and that said Letters Patent is hereby corrected as shown below:

On the Title Page

(72) Inventors should read: Guoying Wang, Beijing (CN); Pan Xu, Beijing (CN); Yicheng Lin, Beijing (CN); Ying Han, Beijing (CN); Xing Zhang, Beijing (CN); Zhen Song, Beijing (CN); Dacheng Zhang, Beijing (CN)

Signed and Sealed this
Twenty-first Day of October, 2025

John A. Squires
*Director of the United States Patent and Trademark Office*